United States Patent [19]

Hagner

[11] Patent Number: 4,604,678
[45] Date of Patent: Aug. 5, 1986

[54] CIRCUIT BOARD WITH HIGH DENSITY ELECTRICAL TRACERS

[75] Inventor: George R. Hagner, San Jose, Calif.
[73] Assignee: Frederick Parker, San Jose, Calif.
[21] Appl. No.: 515,008
[22] Filed: Jul. 18, 1983
[51] Int. Cl.$^4$ ............................................. H05K 1/18
[52] U.S. Cl. ................................. 361/401; 174/68.5; 361/406; 361/407
[58] Field of Search .............................. 361/397–411; 174/68.5; 29/848

[56] References Cited

U.S. PATENT DOCUMENTS

| | | | |
|---|---|---|---|
| 3,281,627 | 10/1966 | Fetterrolf et al. | 361/406 X |
| 3,670,205 | 6/1972 | Dixon et al. | 317/101 CE |
| 3,934,336 | 1/1976 | Morse | 29/627 |
| 4,328,530 | 5/1982 | Bajorek et al. | 361/395 |
| 4,374,457 | 2/1983 | Wiech, Jr. | 361/401 |

FOREIGN PATENT DOCUMENTS 2033667  5/1980  United Kingdom ................... 29/848

OTHER PUBLICATIONS

George H. Stredde, Printed Circuit Board Bus Bars, Western Electric Eng., vol. 23, #1, Jan. 1979, pp. 18 & 20 to 23.
Ho et al, Multiple LSI Silicon Chip Modules with Power Busses Composed of Laminated Silicon Sheets with Metallized Upper and Lower Surfaces, IBM Tech. Disc. Bull., vol. 22, #8A, Jan. 1980, pp. 3410 & 11.

Primary Examiner—R. R. Kucia
Assistant Examiner—T. Basma
Attorney, Agent, or Firm—Townsend & Townsend

[57] ABSTRACT

An improved circuit board having electrically conductive traces connected to respective terminals of a number of electrically current components mounted on a substrate. The substrate has cavities for mounting the components, and a plurality of grooves extend into one or both of a pair of opposed surfaces of the substrate. The grooves are filled by plating with an electrically conductive material to form the traces. Thus, the traces not only extend in the plane of a surface of the substrate but also extend perpendicular to such plane and into the substrate itself whereby a high packing density of traces can be achieved while maintaining essentially electrical paths between the components. The depth of each trace is a number of times greater than the width of the trace, a typical ratio being 10:1. The substrate can be molded from a plateable plastic or ceramic material and the grooves can be machined by a laser beam. The components are assembled before the grooves are plated to minimize production costs and to assure immediate electrical connection between the tracers and the terminals of respective components.

4 Claims, 6 Drawing Figures

CIRCUIT BOARD WITH HIGH DENSITY ELECTRICAL TRACERS

This invention relates to an improved circuit board having a number of electronic components interconnected by electrically conductive traces and, more particularly, to an improved circuit board in which the circuit traces are closely packed and formed by a plating process.

BACKGROUND OF THE INVENTION

In present, conventional printed circuit boards for use in electronic circuitry, the electrical conductors or trace are basically two dimensional in space. A trace on a board of this type is a conductor applied to the upper surface of a substrate, the length and width of the trace being in the x and y directions and the thickness (which is extremely small) being is in the z axis perpendicular to but extending upwardly from the upper surface of the substrate. Electronic components, such as resistors, capacitors and the like, are also placed on the surface of the substrate. Such components typically have lead wires which are coupled to respective traces by inserting the leads into holes which intersect appropriate circuit traces. The leads are attached mechanically and electrically by soldering. If the components are leadless components, they are mounted on the upper surface of a substrate in briding relationhip to respective traces. Such leadless components are held in place temporarily by solder paste or by an adhesive until they are rigidly soldered to the traces to form a permanent bond. This solder joint then serves as a structural attachment and as an electrical joint.

The usual technique for interconnecting electrical components and traces on a conventional printed circuit board is as follows:

1. The various electrically conductive surface traces are provided on the surface of a dielectric substrate. This can be done by using conventional printed circuit board production methods.
2. The components are attached to the substrate in a predetermined arrangement.
3. The terminations of the electrical components are joined to the circuit traces by means of soldering. Typically this is by wave solder (high temperature) at approximately 500° F. or by reflow solder of solder posters. This requires that the substrate remain stable and not exhibit damage or deterioration during or after this cycle. Also, the soldering process requires 100% inspection, repair, and reinspection.

The conventional method of assembling an integrated (semiconductor) chip is by way of bonding gold wires from metallized terminal pads on the chip to a lead frame by use of a thermal bonding machine or an ultrasonic bonding machine. After bonding of the gold wire from the pads to the lead frame, the chip is encapsulated or molded into an integral form.

All of the foregoing techniques in the production of conventional printed circuit boards and integrated circuit chips are time-consuming and relatively expensive. Moreover, a circuit board made in accordance with conventional techniques has electrical traces which take up considerable space on the surface of the substrate so that the surface of the substrate itself must be relatively large to accommodate a large number of traces and components and to provide for traces of sufficient size to carry the signal current necessary to assure proper operation of the circuitry on the substrate.

Since the traces are on the upper surface of the substrate, the traces must have sufficient width to minimize the electrical resistance of the current path defined by the trace. To achieve this end, considerable space is used on the substrate surface. This limitation requires relatively large substrates for relatively complex circuitry, thereby increasing the cost of producing a printed circuit board as well as for assembling the components on the circuit board to form a circuit thereon.

In view of the foregoing limitations of conventional printed circuit boards, a need exists for improved circuit board which avoids such limitations.

SUMMARY OF THE INVENTION

The present invention is directed to an improved circuit board in which the electrical traces of the circuit on the board are formed such that they are in grooves extending into and below the upper surface of a substrate as well as along such upper surface. Thus the widths of the traces on the surface of the substrate can be of minimal size. In this way, there can be many more traces per unit area of circuit board surface than is capable using traces of the type found on conventional circuit boards. Such an arrangement of traces of the circuit board of the present invention permits the mounting of electrical components on the upper surface of the substrate as well as in recesses or cavities in the substrate below its upper surface. Also, the circuit board can be plated to form the traces themselves and the interconnections between the traces and respective electrical components.

The traces in the circuit board of the present invention permits the electrical components of a circuit to be arranged on the substrate in any desired pattern. There is no limitations as to where such components must be located relative to each other. The components can also be inserted into the substrate in cavities or recesses where they are held in place by mechanical interference fit. Also, cavities and recesses can be formed by machining or molding the substrate to any required geometry. The components can be mounted in any desired attitude, such as vertically through the substrate or horizontally relative to the upper surface of the substrate. When mounted vertically, the components may form electrical path segments from the upper surface of the substrate to the lower surface thereof. When the components are mounted vertically, the components may be coupled in electrical series relationship with each other by the use of traces on the upper and lower surfaces of the substrate.

Before the plating process, grooves are molded or cut into the substrate; then, the various electrical components are inserted into the substrate before the plating step. Thus, the components and grooves are electrically interconnected simultaneously during the plating step. These electrical connections will be sufficiently positive to form satisfactory joints.

When using semiconductor chips, as parts of the circuit, the substrate is provided with cavities for receiving the chips. The cavities for the chips will be in a particular location on the substrate relative to the grooves to be plated for forming the traces. The cavities will receive the chips in a close fit and will extend a depth in the substrate of double or more of the chip thickness. The substrate is then machined to form the grooves for the traces, and the end of the grooves extend into the cavities to positions directly over and intersecting the locations at which the metallized terminal pads corresponding to respective traces of the chips will be placed. Thus, the pads will be immediately aligned with respective grooves when the chips are inserted into respective molded cavities.

The chips are then assembled with the circuitry surface, i.e., the pads, toward the grooves. Then, the substrate is plated to form the traces. As the grooves are plated, the connections between the end of the traces and respective pads will also be made. Thus, the chips are fully integrated into the circuit on the substrate.

The present invention provides a number of advantages over conventional circuit boards, foremost of which are as follows:

1. The invention permits the electrical traces of a circuit to be densely packed to thereby minimize the size of a circuit board without sacrificing the reliability of the circuit.
2. The invention eliminates the need for wire bonding of leads to semiconductor chips.
3. The invention provides a circuit board having fewer electrical connections but connections of much higher structural integrity than is found in conventional circuit boards.
4. The invention permits circuit boards to be produced at lower costs compared with the costs of conventional circuit boards.
5. The invention may permit improved dissipation of heat from semiconductor chips because of the improved access to the rear surfaces of such chips.
6. The present invention is also adaptable for design and manufacture of discrete devices, such as integrated circuit packages with terminal leads for insertion into printed wiring boards or other circuit boards.

The primary object of the present invention is, therefore, to provide an improved electronic circuit board which has high density electrical traces arranged to minimize space requirements for a circuit on a substrate while keeping the reliability of the circuit extremely high and while minimizing costs of producing the circuit.

Another object of the present invention is to provide an improved circuit board in which the high density electrical traces are simultaneously formed and electrically coupled to respective electrical components including a semiconductor chips by a plating process to minimize costs of production and to provide a circuit which is highly reliable in operation and which does not require bonding of wires to the components as is required in the manufacture of conventional circuit boards.

Other objects of the present invention will become apparent as the following specification progresses, reference being had to the accompanying drawings for an illustration of the invention.

Figure 1:
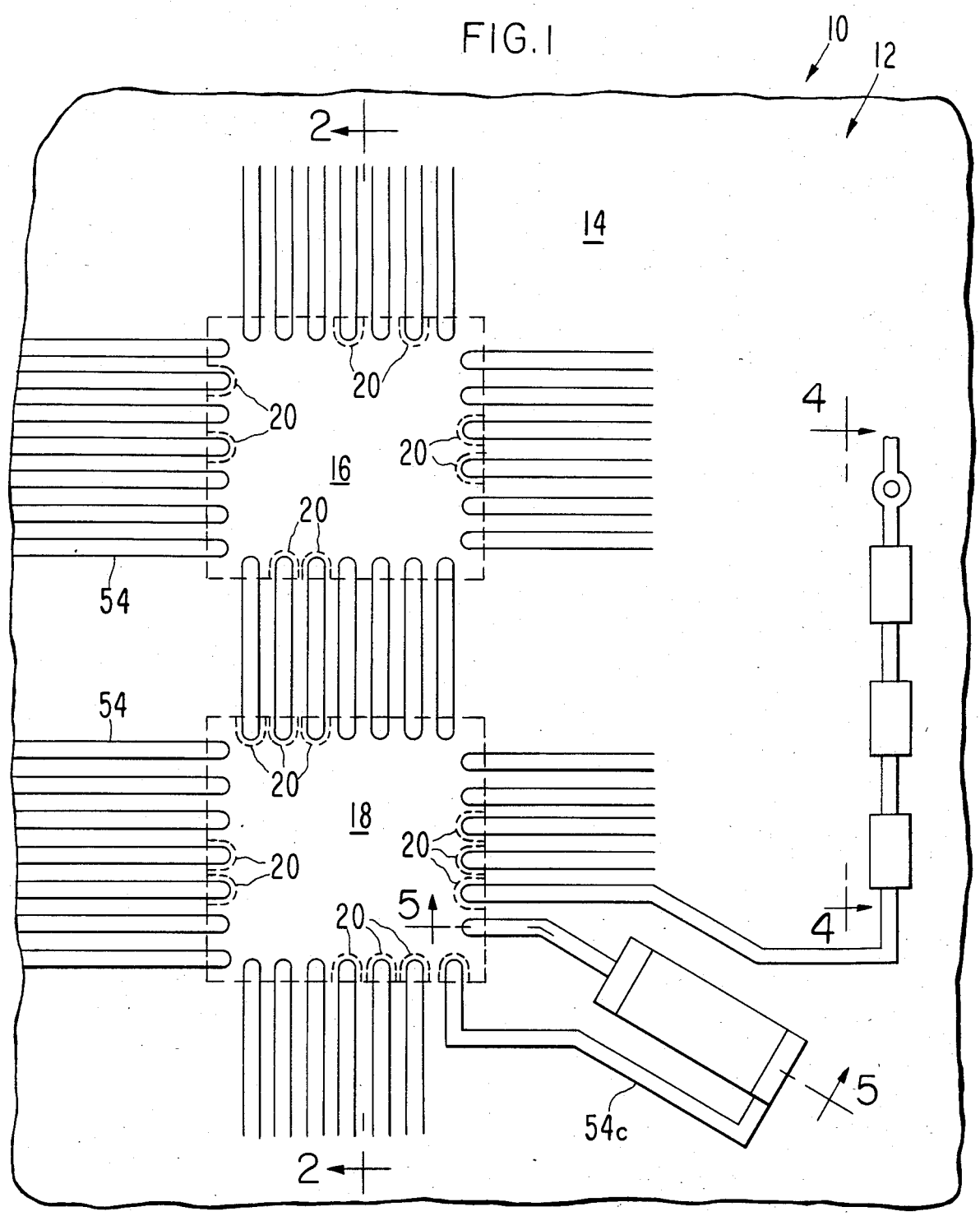
FIG. 1 is a fragmentary, schematic, top plan view of a circuit board made in accordance with the teachings of the present invention, showing a substrate having a pair of integrated circuit chips in combination with several other electrical components and a number of grooves for forming electrical traces which electrically connect the components to form a circuit.

The circuit board selected to describe the teachings of the present invention is broadly denoted by the numeral 10 and is shown schematically in plan form in FIG. 1. Circuit board 10 comprises a substrate 12 having a generally flat upper surface 14 and a generally flat lower surface 15 substantially parallel with upper surface 14. Substrate 12 is of any desired shape, such as rectangular or square, depending upon the specific circuit application for which circuit board 10 is to be designed. Typically, the substrate is molded or extruded from a suitable plastic or ceramic material. A number of commercially available materials are suitable for this purpose. The selection of such material will be made on the basis of plateability, dielectric requirements, and resistance to environmental influences. The substrate will be provided with cavities at design locations for receiving respective components, such as resistors, capacitors, inductors, integrated circuit chips and the like. Also, the substrate can be provided with holes therethrough between the upper and the lower surfaces thereof, and electrical components can be placed in such holes to provides circuit paths through the substrate.

Figure 2:
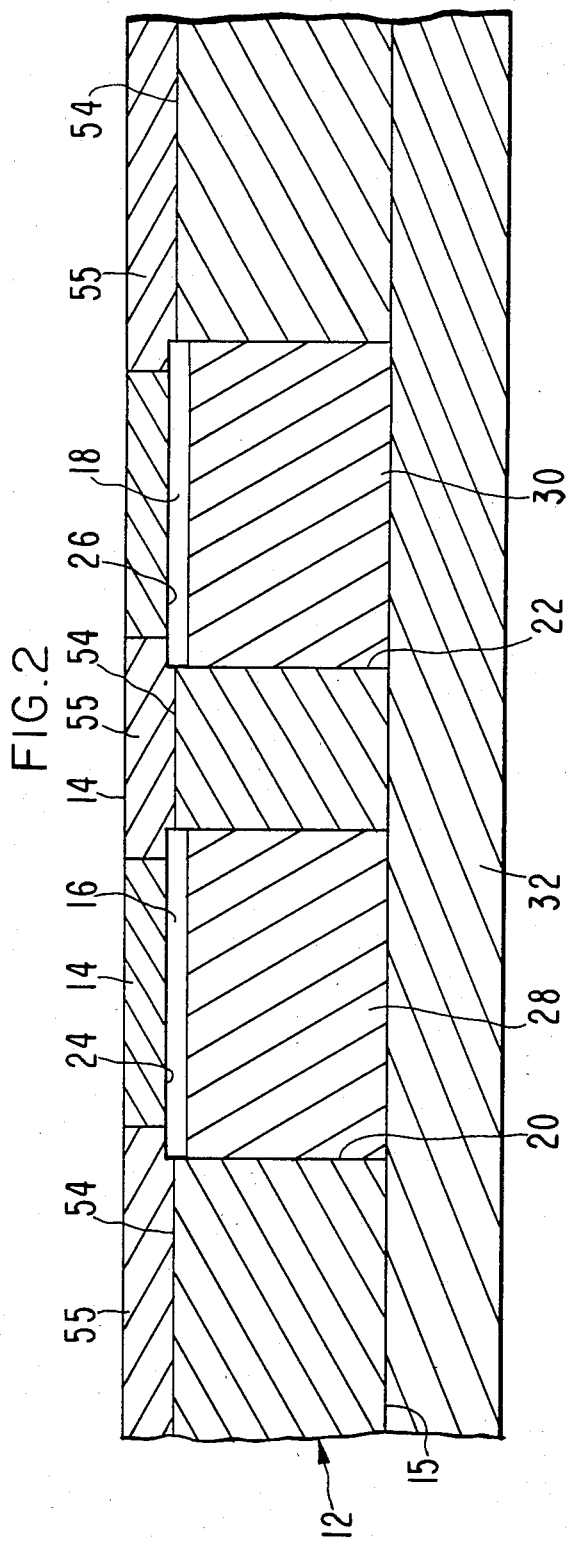
FIG. 2 is an enlarged, cross-sectional view taken along lines 2—2 of FIG. 1.

For purposes of illustration only, circuit board 10 is provided with a pair of integrated circuit chips 16 and 18, each of the chips having outer peripheral pads 20 (FIG. 1) as is well known, whereby electrical connections can be made to the internal circuitry of each chip, respectively. Chis 16 and 18 are placed in the upper ends of internal cavities 20 and 22, respectively, (FIG. 2) the upper ends of the cavities being spaced below of the upper surface 14 of the substrate as shown in FIG. 2. The upper surfaces of chips 16 and 18 bear against the lower surface portions 24 and 26, respectively, of the substrate, surface portions 24 and 26 defining the upper boundaries of cavities 20 and 22, respectively. The remaining parts of cavities 20 and 22 are filled with heat sink members 28 and 30, respectively, and a large heat sink element 32 applied to surface 15 of the substrate is in heat exchange relationship with heat sink members 28 and 30. Thus, heat generated due to the operations of the circuit portions of chips 16 and 18 can be dissipated through heat sink members 28 and 32 to heat sink element 32, and element 32 will dissipate its absorbed heat to the atmosphere. Thus, chips 16 and 18 will operate efficiently notwithstanding the fact that the chips are essentially embedded in the substrate and are not encapsulated as they are normally are in conventional, molded housings.

Figure 4:
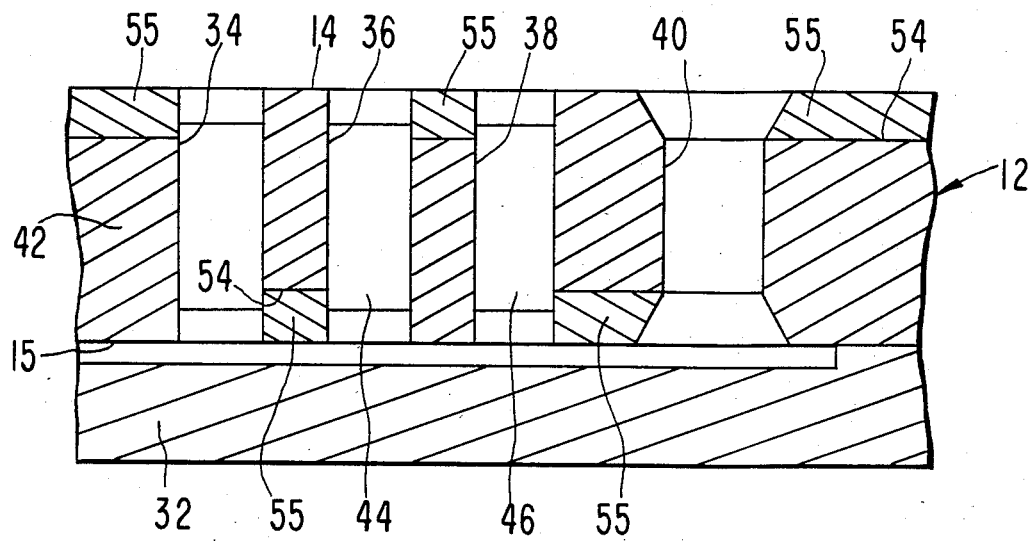
FIG. 4 is a cross-sectional view of the circuit board of FIG. 1, looking in the direction of line 4—4 of FIG. 1.
Figure 5:
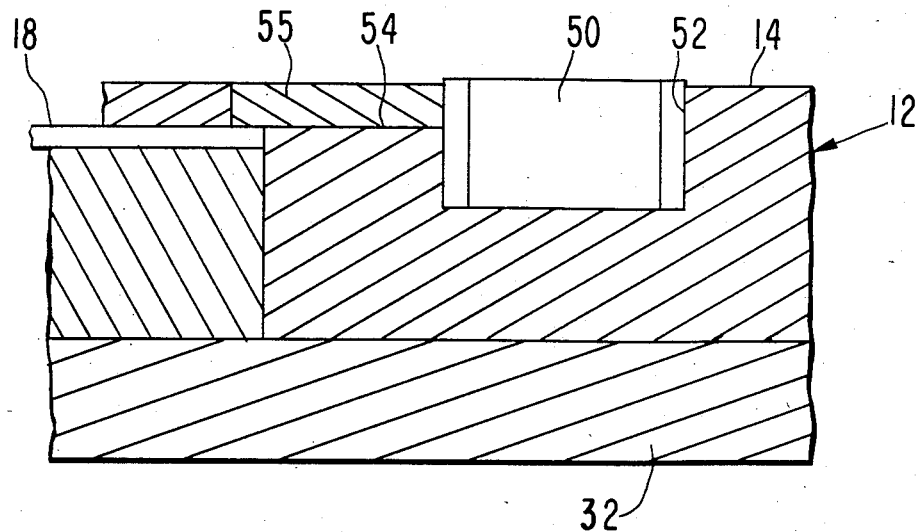
FIG. 5 is a view similar to FIG. 4 but looking in a direction of line 5—5 of FIG. 1.

FIGS. 4 and 5 show the way in which substrate 12 can be provided with additional cavities and even holes therethrough for mounting of individual components, such as resistors, capacitors and inductors. FIG. 4 shows that substrate 12 is provided with a number of generally parallel holes 34, 36, 38, and 40 from the upper surface 14 to the lower surface 15 of the substrate. For purposes of illustration, leadless resistors 42, 44, and 46 are shown as being placed in holes 34, 36, and 38. Hole 40 is provided typically to permit a plated layer (not shown) on the inner surface of the hole for bridging the distance between two traces or electrical leads (hereinafter described) on the upper and lower surfaces 14 and 15, respectively. FIG. 4 also shows that the heat sink 32 is spaced below surface 15 so as to avoid any heat exchange relationship with resistors 42, 44, and 46 in holes 34, 36 and 38, respectively.

FIG. 5 shows a leadless capacitor 50 press fitted into a cavity 52 extending into substrate 12 from the upper surface 14 thereof. Capacitor 50 is also spaced upwardly from heat sink 32 so as to be out of heat exchange relationship therewith.

The relative locations of resistors 42, 44, and 46 and capacitor 50 relative to chips 16 and 18 are shown in FIG. 1. These locations are for purposes of illustration only, it being understood that these components as well as a number of other components, can be at different locations on the substrate depending upon the design of the circuit as will be more fully described hereinafter. Moreover, they are not encapsulated as they are normally are for use in conventional circuit boards.

FIGS. 4 and 5 show the way in which substrate 12 can be provided with additional cavities or holes therethrough for mounting of individual components, such as resistors, capacitors and inductors, on the substrate. FIG. 4 shows that substrate 12 is provided with a number of generally parallel holes 34, 36, 38, and 40 extending from the upper surface 14 to the lower surface 15 of the substrate. For purposes of illustration, leadless resistors 42, 44, and 46 are shown in holes 34, 36, and 38. Hole 40 can be provided to permit a plated layer (not shown) on the inner surface of the hole to bridge the distance between two electrical traces (hereinafter described) on the upper and lower surfaces 14 and 15, respectively. FIG. 4 also shows that the heat sink 32 is spaced below the lower ends of holes 34, 36, 38 and 40 so as to avoid any heat exchange relationship with resistors 42, 44, and 46 in holes 34, 36 and 38, respectively.

FIG. 5 shows a leadless capacitor 50 press fitted into a cavity 52 extending into substrate 12 from the upper surface 14 thereof. Capacitor 50 is also spaced upwardly from heat sink 32 so as to be out of heat exchange relationship therewith.

The relative locations of resistors 42, 44, and 46 and capacitor 50 relative to chips 16 and 18 are shown in FIG. 1. These locations are for purposes of illustration only, it being understood that these components as well as a number of other components, can be at different locations on the substrate depending upon the design of the circuit as will be more fully described hereinafter. Moreover, the resistors 42, 44, and 46 are shown in a horizontal alignment with each other in FIG. 1; however, it is to be understood that such resistors are in vertically extending holes 34, 36 and 38 in substrate 12 as shown in FIG. 4.

Substrate 12 also has a plurality of grooves formed therein by machining or by molding. If machined, the grooves can be formed by a laser. These grooves are to be filled or plated with an electrically conductive material so as to form the electrical traces which connect to specific pads 20 of chips 16 and 18 and also connect to the various electrical components of the circuit on substrate 12, including resistors 42, 44, and 46 and capacitor 50, all of have been only selected for purposes of illustrating the teachings of the present invention.

Figure 3:
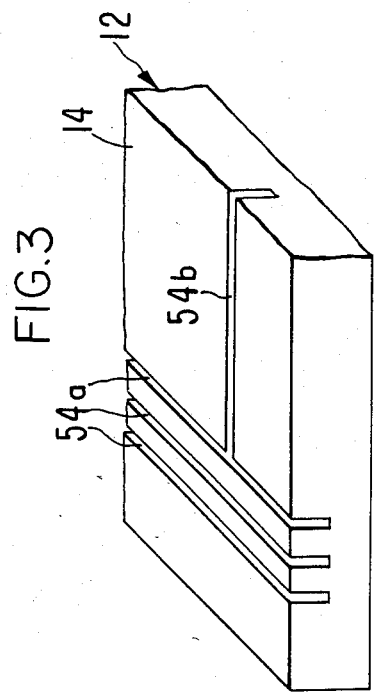
FIG. 3 is an enlarged, fragmentary, perspective view of the circuit board, showing the way in which the traces extend into the substrate from the upper surface thereof.

As shown in FIG. 1, substrate 12 has a plurality of grooves 54 for the various pads 20 of chips 16 and 18, there being a groove 54 for each pad 20, respectively, of each chip. These grooves are formed in upper surface 14 and extend to a finite depth into the substrate. Moreover, the grooves can be extremely narrow in width and can be a number of times less in width than they are in depth as shown in FIG. 3. This feature permits the grooves to be densely packed in the substrate while assuming that the electrically conducting material in the grooves (as hereinafter described) will become the electrical circuit paths.

While the grooves in FIG. 1 are shown as relatively large in width, they can be extremely small in width. Also, the inner ends of each groove 54 overlie a respective pad 20 on a chip 16 or 18 as shown in FIG. 1. The depth of each groove 54 can be flush with or slightly greater than the depth at which each pad 20 is located in the substrate as shown in FIG. 2. Thus, when the groove is plated with an electrically conducting material, the material will be in positive electrical contact with the pad.

Both the upper surface 14 and the lower surface 15 of substrate 12 can be provided with grooves 54. In this way, the substrate can be more efficiently used in forming a specific circuit as defined by the locations of the components and chips on the substrate as well as the specific patterns of grooves 54 which contain electrically conducting material.

As shown in FIG. 2, electrical traces or leads 55 are in grooves 54, and the inner ends of the traces overlie and are in electrical contact with respective pads of chips 16 and 18. As shown in FIG. 1, all pads 20 can be provided with respective traces 55 because there is a groove 54 for each pad, respectively. FIG. 3 illustrates how adjacent grooves can extend transversely of each other. For instance, a first groove 54a extending in one direction in the upper surface 14 of substrate 12 can meet and communicate with a second groove 54b extending transversely from groove 54a. Thus, plateable electrically conducting material in grooves 54a and 54b will be in electrical contact with each other to form a branch electrical path as required for forming specific circuit on the substrate 12. Other grooves 54a (FIG. 3) are parallel with the first-mentioned groove 54a and can be coupled with respective branches in the same manner as that illustrated in FIG. 3 with respect to branch 54b.

FIG. 4 shows how traces 55 can be formed in the upper and lower surfaces 14 and 15 of substrate 12. Thus, with traces 55 as shown in FIG. 4, resistors 42, 44 and 46 can be in series relationship with each other, and the lower end of resistor 46, through its adjacent trace 55, can be in electrical contact with another component (not shown) in hole 40. In the alternative, the interior surface of hole 40 can be plated so as to make electrical contact with the next adjacent trace 55 on the upper surface 14 of substrate 12. In all cases, traces 55 in FIG. 4 make electrical contact with adjacent leadless end terminals of respective resistors 42, 44, and 46 without requiring a soldering or other bonding step to assure electrical contact.

FIG. 5 shows how an electrical trace 55 in a groove 54 makes electrical contact between a pad 20 on chip 18 and one end terminal of a leadless capacitor 50. The other end terminal of the capacitor is coupled by a trace in groove 54c (FIG. 1) extending to a specific pad 20 on chip 18.

While many different types of circuits can be employed with substrate 12, the circuit shown in FIG. 1 is selected for purposes of illustration only. The present invention is, therefore, not to be considered limited to this specific circuit.

The process of producing circuit board 10 includes a number of steps, starting with the formation of the substrate. The substrate is molded or extruded from a plastic or ceramic material. Molding of the substrate includes forming cavities 20 and 22 (FIG. 2) for chips 16 and 18, forming holes 34, 36, 38 and 40 (FIG. 4) for resistors 42, 44 and 46, and forming well as recess 52 (FIG. 5) for capacitor 50. The location of the cavities and holes will be compatible with circuitry trace requirements as pre-arranged on a circuit drawing.

After the substrate has been molded, the trace grooves 54 are machined in the upper and and lower surfaces of the substrate. This can be accomplished by a laser or other suitable means.

The trace geometry will be determined by the electrical requirements for conductivity paths between the various components of the circuit to be formed. The traces can be machined by the laser to a relatively high aspect ratio. For instance, the aspect of the grooved geometry which is ratio can be in the range of 2:1 to 15:1 but usually will be approximately 10:1, i.e., a groove 0.004 inch wide can be machined to a depth of 0.040 inch. When plated to form electrical conductive traces 55, the grooves will be plated to fill them with electrically conducting material, and the cross sectional area of the traces will be 0.0016 square inch.

After machine of grooves 54 and before plating, the various components are now assembled to substrate 12. Such components include chips 16 and 18, resistors 42, 44, and 46, and capacitor 50 for the particular circuit described above. Other components may be added as needed or desired to form a given circuit; however, for purposes of discussion herein, only those components shown in FIG. 1, 2, 4 and 5 will be mentioned. With the above components assembled to the substrate, the substrate is then plated. There may be certain components, such as chip 16 and 18 which are vulnerable to pre-plating process. In such a case, these components will not be assembled until after pre-plating has been accomplished but will be assembled before plating.

The plating of the molded and assembled boards is then accomplished by conventional printed circuit board plating techniques using either additive or semi-additive technologies, to ensure that only those areas get plated which form the circuitry.

The teachings of the present invention provide a circuit board of high reliability and one which is simple and rugged in construction. The circuit board is made in a manner such that no wire bonding is required for integrated circuits and no soldering required for electronic components since everything is interconnected by plating rather than by soldering. The construction of the traces allows for high density packing of electrical conductivity paths of the circuit of the circuit board. This feature permits the size of the circuit board to be relatively small.

Figure 6:
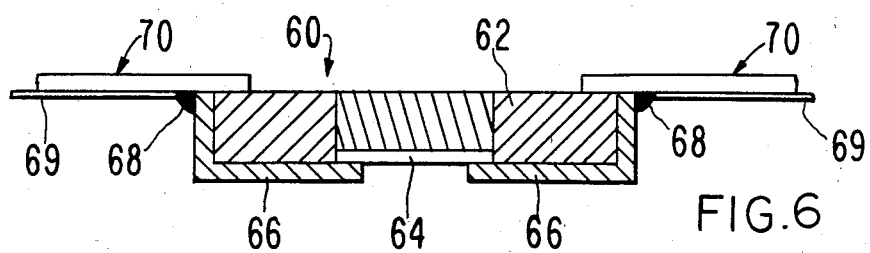
FIG. 6 is a cross sectional view of an integrated circuit package using the teachings of the present invention.

A typical application of a circuitry requires special mention since it has only one component in the circuit. This application is shown in FIG. 6 and is one of providing a package 60 for an individual integrated circuit. In this application the chip carrier 60 is the support for an individual chip 66. The circuit paths defined by traces 66 are either connected to leads or become the pads 68 for mounting the chip carrier to leads 69 of the printed circuit board 70. The chip is plated in place into the chip carrier by the methods described above and the chip carrier becomes an eleronic component. Thus the above invented process replaces wire bonding the chip carriers.

What is claimed is:

1. An electrical circuit board comprising: a substrate having a surface provided with a plurality of grooves; a number if discrete electrical components adapted to be carried by the substrate near the surface thereof and to be coupled together to form an electrical current carrying path, each component having a pair of terminals; and a plurality of electrically conductive traces in respective grooves and interconnecting the terminals of the components in a manner to form said electrical current carrying path, each trace having a depth, the depth of at least certain of the traces being a number of times greater than the width of the traces, each groove having a bottom and a pair of sides, each trace being a mass of electrically conductive material substantially filling the respective 2. A circuit board as set forth in claim 1, wherein the depths of the traces are 2 to 15 times greater than the width of the traces.

3. A circuit board as set forth in claim 1, wherein the substrate has a recess extending into said surface thereof, one of the components being leadless and received in the recess, a trace having one end in electrical contact with said one component and extending from the recess to another location adjacent to and in electrical contact with a second component.

4. A circuit board as set forth in claim 1, wherein said one component has a pair of leads defining the terminals thereof, said leads being bonded to a pair of traces.

* * * * *